United States Patent [19]
Kawakami

[11] Patent Number: 5,986,460
[45] Date of Patent: Nov. 16, 1999

[54] BGA PACKAGE SEMICONDUCTOR DEVICE AND INSPECTION METHOD THEREFOR

[75] Inventor: Toshio Kawakami, Kakogawa, Japan

[73] Assignee: Ricoh Company, Ltd., Tokyo, Japan

[21] Appl. No.: 08/674,539

[22] Filed: Jul. 2, 1996

[30] Foreign Application Priority Data

Jul. 4, 1995 [JP] Japan ..................... 7-191226

[51] Int. Cl.⁶ .................. G01R 31/26; H01L 23/58
[52] U.S. Cl. ........................... 324/765; 324/754
[58] Field of Search .................. 324/537, 754, 324/700, 705; 438/14, 18

[56] References Cited

U.S. PATENT DOCUMENTS

| | | | |
|---|---|---|---|
| 5,213,676 | 5/1993 | Reele et al. | 205/118 |
| 5,288,539 | 2/1994 | Araki | 428/136 |
| 5,289,631 | 3/1994 | Koopman et al. | 29/840 |
| 5,298,464 | 3/1994 | Schlesinger et al. | 437/216 |
| 5,378,981 | 1/1995 | Higgins, III | 324/765 |
| 5,447,264 | 9/1995 | Koopman et al. | 28/563 |
| 5,474,957 | 12/1995 | Urushima | 437/209 |
| 5,554,940 | 9/1996 | Hubacher | 324/765 |

OTHER PUBLICATIONS

Rational for adopting BGA, Nikkei Electronics, Feb. 14, 1994, at 59–73 (Partial english translation provided herewith).

ASIC, Nikkei Electronics, Mar. 20, 1989, at 209–216 (Partial english translation provided herewith).

*Primary Examiner*—Michael Brock
*Attorney, Agent, or Firm*—Cooper & Dunham LLP

[57] ABSTRACT

A semiconductor device includes a substrate, a semiconductor chip provided on the substrate, a plurality of terminals provided on a first side of the substrate, each electrically connected to the semiconductor chip and a plurality of test pads for performing electrical characteristic tests on the semiconductor chip, each test pad being electrically connected to a respective terminal in one-to-one correspondence.

19 Claims, 9 Drawing Sheets

BGA PACKAGE SEMICONDUCTOR DEVICE AND INSPECTION METHOD THEREFOR

BACKGROUND OF THE INVENTION

1. Field of the Invention

The present invention relates to semiconductor devices and methods for inspecting and testing semiconductor devices and, more specifically, to BGA (ball grid array) semiconductor devices and inspection and test methods therefor.

2. Description of the Related Art

As semiconductor technology evolves, the complexity of the circuitry capable of being placed on a semiconductor chip increases while at the same time, the size of the semiconductor package decreases. In order to take full advantage of evolving semiconductor technology, the number of signal input/output (I/O) leads per chip must increase, requiring a reduction in spacing between adjacent peripheral I/O leads on the semiconductor device.

A quad-flat-pack (QFP) semiconductor device has been used for relatively low pin count surface mount applications. A QFP device can allow an outer lead pitch of 0.5 mm. Although some applications of QFP can allow for an outer lead pitch of 0.4 mm or even 0.3 mm, this generally results in a lower assembly yield. The body size of QFP devices is typically on the order of 28 mm or less, resulting in a peripheral I/O pin count far below that necessary in many applications.

Figure 9A:
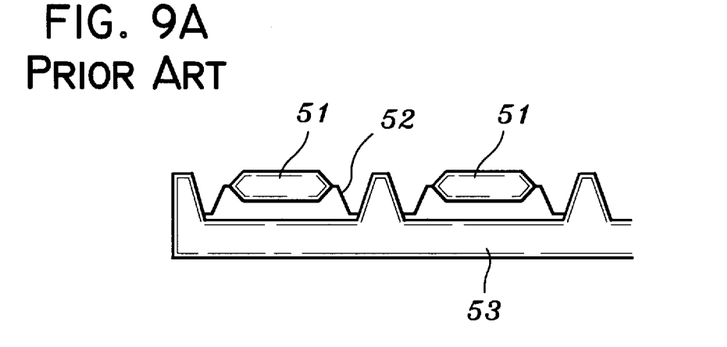
FIGS. 9A–9C are views showing a process for performing a conventional electrical test on a QFP semiconductor device.
Figure 9B:
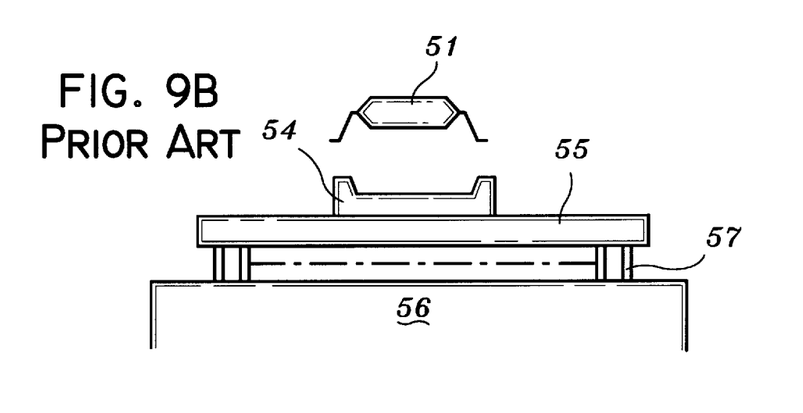
Figure 9C:
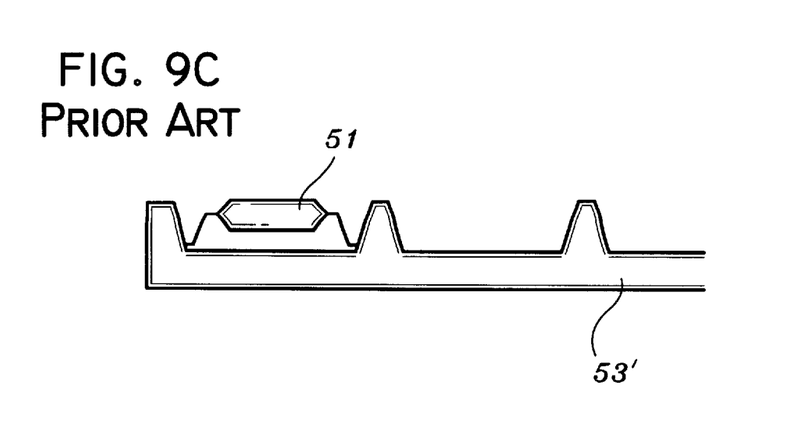

FIGS. 9A–9C depict the operational flow of QFP devices being tested utilizing a conventional test setup. QFP devices 51 are initially prearranged in an insulated plastic tray 53 with their leads 52 positioned on the lower side, as shown in FIG. 9A. A DUT (device under test) board 55 having a socket 54 designed to accommodate QFP device 51, is situated on contact probes 57 provided on test head 56 (e.g., an electrical measurement and/or test device). Socket 54 has a plurality of electrical contacts (not shown) each corresponding to a lead 52 of QFP device 51. The electrical contacts include leads which extend to the bottom of DUT board 55, where additional contacts are provided, each corresponding to a contact probe 57. Contact probes 57 provide I/O signals between test head 56 and QFP device 51 under test. That is, the side of DUT board 55 opposite to which socket 54 is mounted, is electrically connected to test head 56 via contact probes 57.

Typically, utilizing automated equipment (not shown), a QFP device 51 is picked up and removed from tray 53 and placed into socket 54, as shown in FIG. 9B. The QFP device is then subjected to a predetermined series of electrical tests and/or measurements by test head 56. After the tests and/or measurements are completed, the tested QFP device is returned to a second tray 53', with the same side facing up, as shown in FIG. 9C.

Although such a QFP semiconductor device provides a sufficient number of peripheral I/O pins for many applications, as noted above, the maximum number of I/O pins is still far less than that necessary in many applications.

To provide a higher peripheral I/O contact count, a ball-grid-array (BGA) semiconductor device is often employed. The BGA semiconductor device allows an I/O pad or ball pitch, on the order of 1.5 mm for high I/O requirements, typically resulting in 225 I/O connection points (e.g., see Nikkei Electronics, Feb. 14, 1994, p60–p67).

Figure 7A:
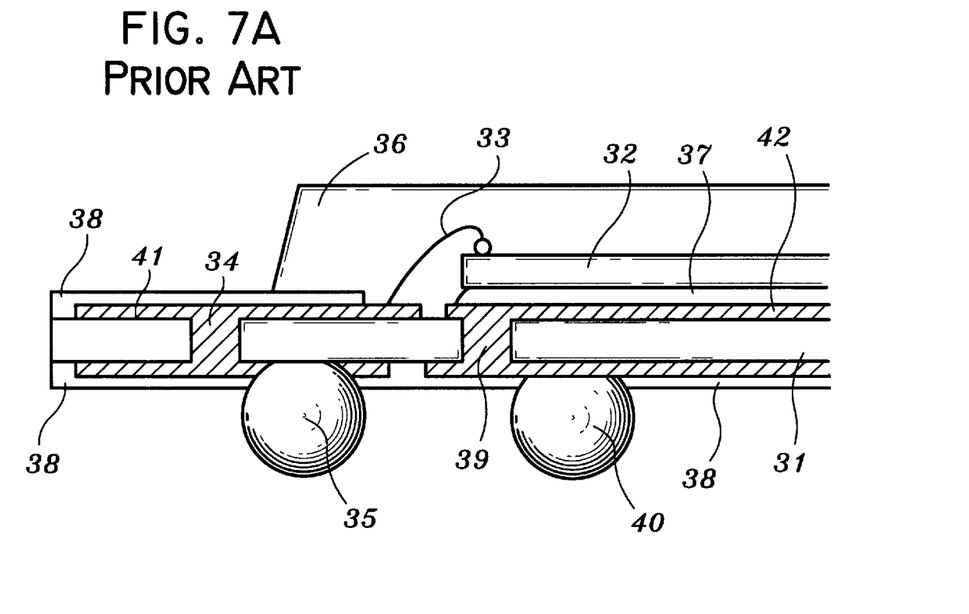
FIGS. 7A and 7B are a magnified cross-sectional view and a magnified partial top plan view, respectively, of a conventional BGA semiconductor device.
Figure 7B:
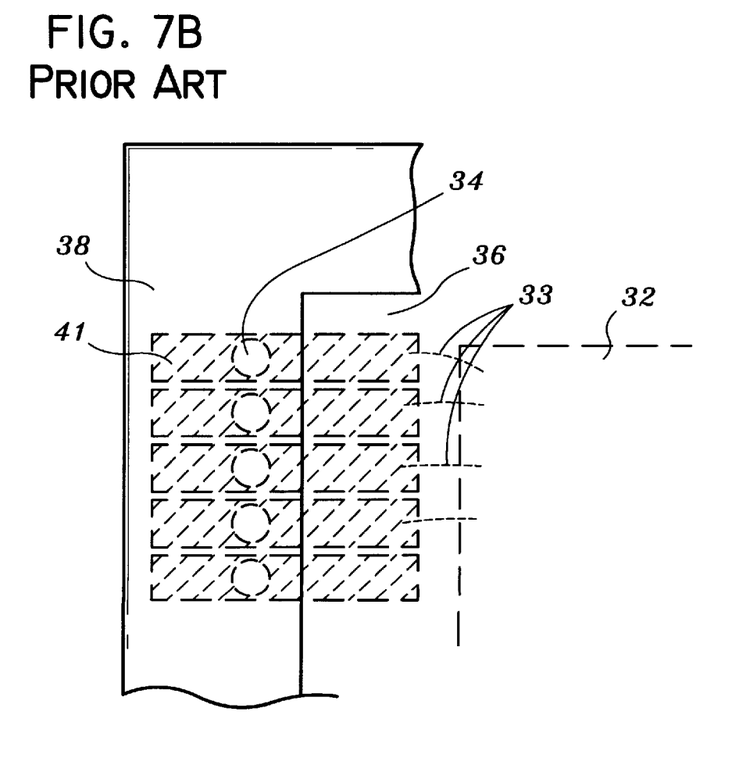

FIGS. 7A and 7B show in cross-section and a top plan view, respectively, a typical BGA device. In the typical BGA device, semiconductor chip 32 is die-bonded to one side of substrate 31 utilizing a heat resistant bonding resin such as die-bonding epoxy plastic 37. Each electrical I/O connection of semiconductor chip 32 is electrically connected to a corresponding conductor pattern 41 (the shaded portion as shown in cross-section in FIG. 7A) via a bonding wire 33. Each conductor pattern 41 extends via a through-hole 34 to the opposite side of substrate 31 as shown. Solder resist 38 is provided on the device to electrically insulate and protect conductor patterns 41, and a molding resin 36 encapsulates semiconductor chip 32 and bonding wires 33. Solder balls 35 are formed on a bottom surface of the device and provide I/O connection points. Each conductor pattern 41 is electrically connected to a corresponding solder ball 35. Solder balls 35 thus form terminals that can be electrically connected to a test head or to a BGA socket for providing electrical signals to and from semiconductor chip 32.

Additional solder balls 40 may be provided in the central portion of the device for the transfer of heat to and from semiconductor chip 32. For example, through-holes 39 and conductor pattern 42 act as thermal piers for the transfer of thermal radiation (e.g., heat) from solder balls 40 to semiconductor chip 32 during a semiconductor heating process performed during chip testing. In addition, they also act as heat sinks to provide radiational cooling by transferring heat away from semiconductor chip 32 when the semiconductor chip is operating.

An inspection method is known according to which test pads are provided on the face of the printed-circuit board, opposite the area to which the BGA is mounted (Nikkei Electronics, Feb. 14, 1994, p68–p73). In another well-known method, which helps to facilitate inspection after mounting, a scan design method is utilized for an automatic testing process for ASICs (Nikkei Electronics, Mar. 20, 1989, P209–p216).

Figure 8A:
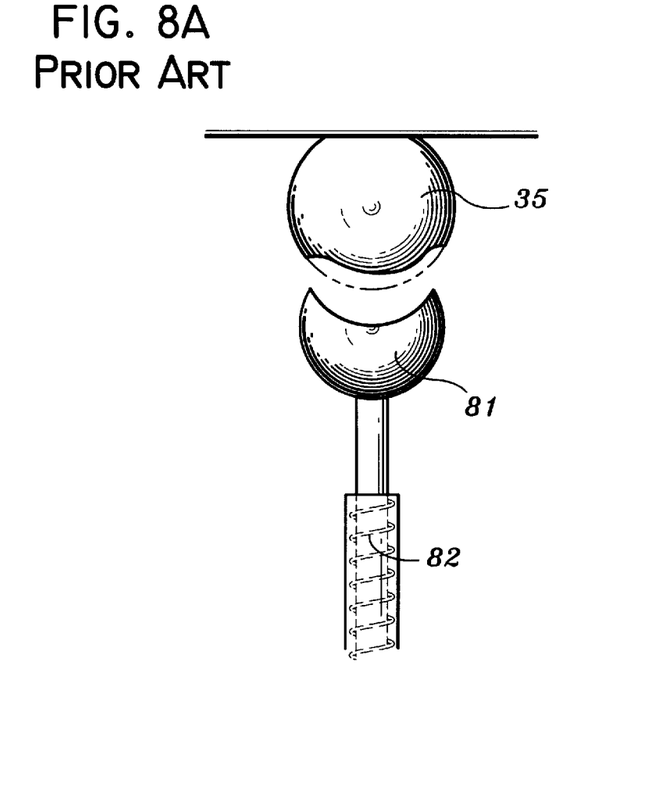
FIGS. 8A and 8B are views of a socket type probe and a pin type probe, respectively, typically used to probe a BGA semiconductor device during testing.
Figure 8B:
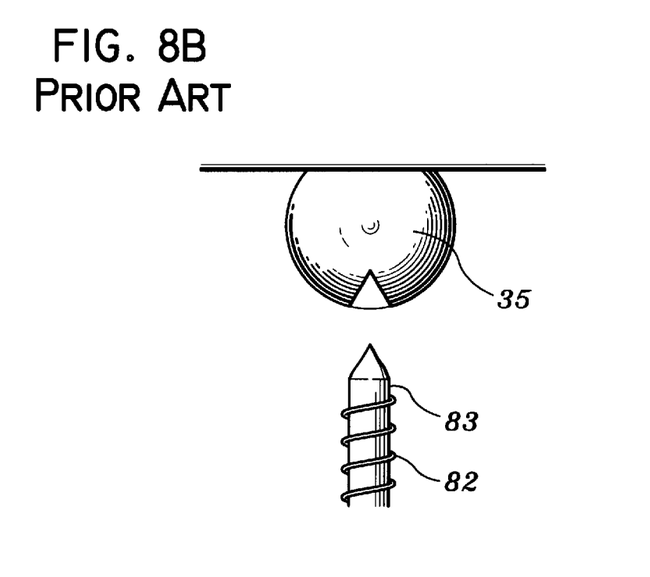

Utilizing conventional techniques to test the BGA package semiconductor device, it is necessary to electrically connect each I/O solder ball 35 to a test probe. Typically, this is accomplished by bringing a probe such as a pin 83 or a socket 81 (shown in FIGS. 8A and 8B) into contact with each solder ball. The probes may or may not be provided with a spring 82 for urging the probes toward the solder balls. Pressure is applied to the BGA package so that the solder balls are forced against the probes, to ensure positive electrical contact between the probes and the solder balls. However, this procedure can result in the generation of flaws such as dents or chips on the surfaces of the solder balls. For example, as shown in FIG. 8A, a socket probe 81 can be used to electrically connect each solder ball 35 of a BGA device to a specially designed test head. However, the solder forming the solder balls is typically a very soft material. Accordingly, when the BGA device is pressed down, urging solder balls 35 against socket probes 81, the solder balls may tend to deform as shown. As shown in FIG. 8B, if pin-type probes 83 are used, the solder balls may tend to dent or chip.

Such irregularities or flaws on the solder balls are unacceptable, since the solder balls are designed for mating with corresponding contacts in a BGA mounting socket. Accordingly, any irregularities or flaws on the solder balls may prevent good electrical contact from being made between the solder balls and the mounting socket contacts.

To perform comprehensive testing of a semiconductor device, the device is often heated to a predetermined temperature utilizing a heat plate and then subjected to additional electrical tests. Heating of a BGA device is conventionally performed by placing the BGA device on the heat plate with the solder balls on the heating surface. However, heating the semiconductor device in this manner is inefficient and time consuming. In addition, since the solder balls on a BGA device are arranged closely together, it is important that a visual inspection of the ball grid array be performed. However, such a visual inspection requires additional steps to be performed in the typical test procedure. For example, during electrical testing the BGA device is currently arranged on a test head socket with the solder ball side of the device face down on the test head. However, visual inspection of the ball grid array requires that the BGA device be flipped over or inverted to allow the surface of the semiconductor device having the solder balls to be viewed. This requires more test time per device and also requires more complex and costly automated equipment to invert the semiconductor device.

SUMMARY OF THE INVENTION

It is preferable that the electrical characteristic testing of a BGA device be performed at low cost. Accordingly, the use of relatively inexpensive testing devices is preferable. It would be desirable to use test equipment currently used to test other types of semiconductor devices such as QFP devices to also test BGA devices, without having to provide additional automated equipment capable of inverting each BGA device so that a visual inspection of the ball grid array can be performed.

In addition, to more cost effectively perform comprehensive tests on a BGA device, it would be desirable if the BGA device could be heated to a predetermined temperature in as short a short time as possible in order to reduce the overall test time required for testing each device.

It would also be desirable if the BGA device could be subjected to the heating, electrical testing and visual inspection steps during the test procedure, without the need to invert the BGA device prior to performing one or more of these steps.

The present invention achieves these and other advantages not previously possible. According to an embodiment of the present invention, a semiconductor device includes a substrate and a semiconductor chip provided on the substrate. A plurality of terminals is provided on a first side of the substrate and each is electrically connected to the semiconductor chip. A plurality of test pads is also provided on the substrate for performing electrical characteristic tests on the semiconductor chip, each test pad being electrically connected to a respective terminal in one-to-one correspondence. The plurality of test pads can be provided on the same side of the substrate as the plurality of terminals or on a side of the substrate different from the side on which the plurality of terminals is provided. For example, the test pads can be provided on a side of the substrate opposite the side on which the plurality of terminals is provided. In the alternative, the plurality of test pads can be provided both on the side of the substrate having the plurality of terminals and also on the opposite side.

According to a preferred embodiment, the semiconductor device comprises a BGA package semiconductor device and the plurality of terminals comprise a plurality of solder balls provided on the first side of the substrate.

A method is described for electrically testing a semiconductor device. The method comprises the steps of providing a semiconductor device including a substrate, a semiconductor chip provided on the substrate, a plurality of terminals provided on a side of the substrate and electrically connected to the semiconductor chip and a plurality of test pads for performing electrical characteristic tests on the semiconductor chip, each test pad being electrically connected to a respective terminal in one-to-one correspondence. The method includes the steps of providing the semiconductor device in a test bed tray with the side of the substrate having the plurality of terminals facing upward, bringing contact probes into contact with the test pads from the side opposite the side having the plurality of terminals and performing electrical tests on the semiconductor device. After the electrical testing is complete, the semiconductor device is allowed to remain in the test bed tray with the side of the substrate having the plurality of terminals facing upward. The semiconductor device can be placed onto a heated plate so that the semiconductor device can be heated and then subjected to high temperature electrical testing. According to a preferred embodiment, a molding resin covering the semiconductor chip can be brought into contact with the heated plate to heat the chip.

According to an embodiment, the heated plate is part of the test bed upon which the semiconductor device is tested, such that the test probes are brought into contact with the test pads and the heated plate is brought into contact with the semiconductor chip from the same side surface of the substrate.

Since the chip remains with the terminals or balls on top, a visual inspection of the balls can be easily performed.

The present invention thus allows a conventional test head for QFP packages to be used to also test BGA packages, since the connection to the test pads can be effected from the lower side of the semiconductor device. In addition, it is also possible to perform visual inspection of the BGA device after the electrical characteristic tests have been performed, without extracting the device from the tray and flipping it over, since the solder balls are still exposed after the semiconductor device is tested and placed in the tray. Since the solder balls do not need to be probed, they remain completely intact with no deformation.

BRIEF DESCRIPTION OF THE DRAWINGS

A better understanding of the objects, features and advantages of the invention can be gained from a consideration of the following detailed description of the preferred embodiments thereof, in conjunction with the appended figures of the drawings, wherein a given reference character always refers to the same or like element or part and wherein.

DESCRIPTION OF THE PREFERRED EMBODIMENTS

According to various embodiments of the present invention, a BGA package semiconductor device is provided with test pads that can be electrically connected to a test head.

Figure 1A:
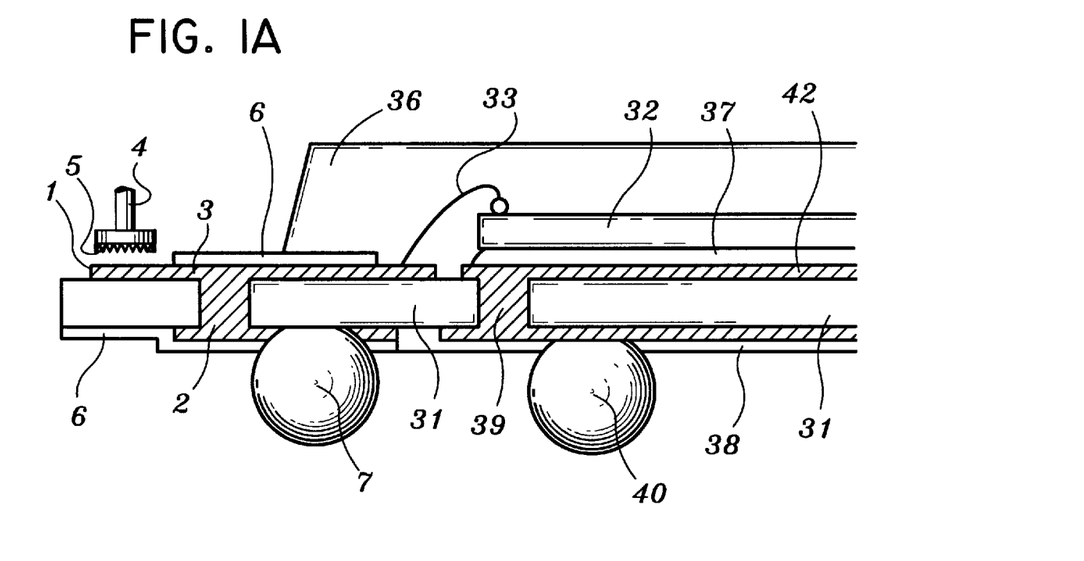
FIGS. 1A and 1B are a magnified partial cross-sectional view and a magnified partial top plan view, respectively, of a BGA semiconductor device according to an embodiment of the present invention.
Figure 1B:
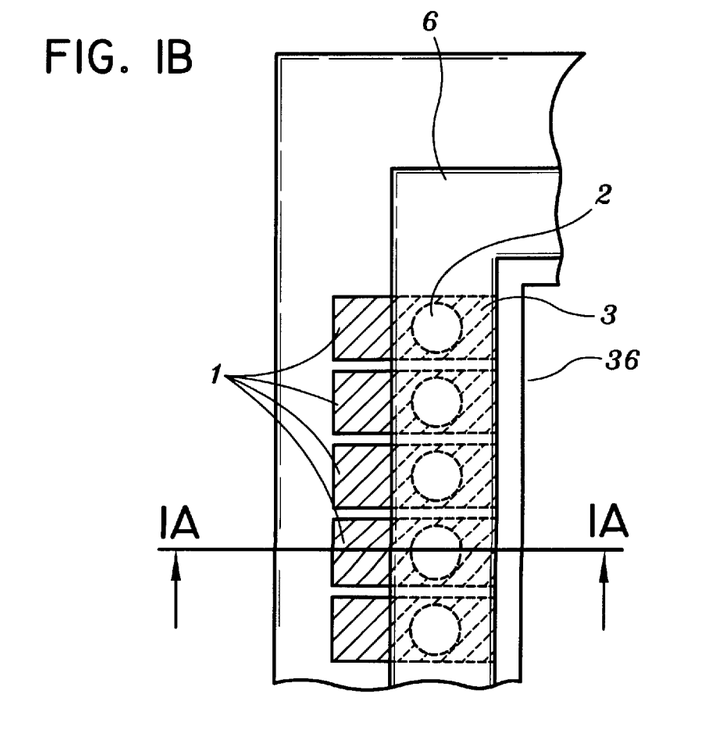

FIGS. 1A and 1B depict a BGA package semiconductor device according to an embodiment of the present invention. According to this embodiment of the present invention, conductor patterns 3 extend beyond an outside edge of solder resist 6 to form exposed test pads 1. Each test pad 1 corresponds to a respective solder ball 7. That is, test pads 1 are provided in one-to-one correspondence with solder balls 7. A protective coating may or may not be provided on test pads 1. For example, it may be preferable to provide a thin layer of gold plating (not shown) on the exposed conductive pattern forming test pads 1, to protect and enhance the electrical conductivity properties of the test pads.

To ensure sufficient contact area for test probing, conductor patterns 3 are designed so that the exposed portions extend approximately 0.5 mm beyond solder resist 6 and are approximately 0.5 mm wide forming test pads 1. Of course, the size and shape of the test pads can be other than that shown. That is, the dimensions of the test pads can be any desired size depending, for example, on the size of the test probe tips to be used to test the device. In addition, although test pads 1 are shown as square in shape, the test pads can be any desired shape, such as rectangular, round, triangular etc. In addition, although only a single row of through-holes 2 are depicted for clarity of illustration purposes, a BGA device may typically include two or more staggered rows of through-holes. According to the present invention, test pads 1 can extend from some or all of the conductor patterns.

During manufacture of the BGA semiconductor device according to the present invention, test pads 1 are easily formed by selectively applying solder resist 6 to leave a portion of conductor patterns 3 exposed along the top (e.g., the side opposite the solder balls) peripheral edges of the semiconductor package as shown in FIG. 1B.

According to the above-described embodiment of the present invention, test pads 1 are provided on the side of substrate 31 opposite the side on which solder balls 7 are formed.

Figure 2A:
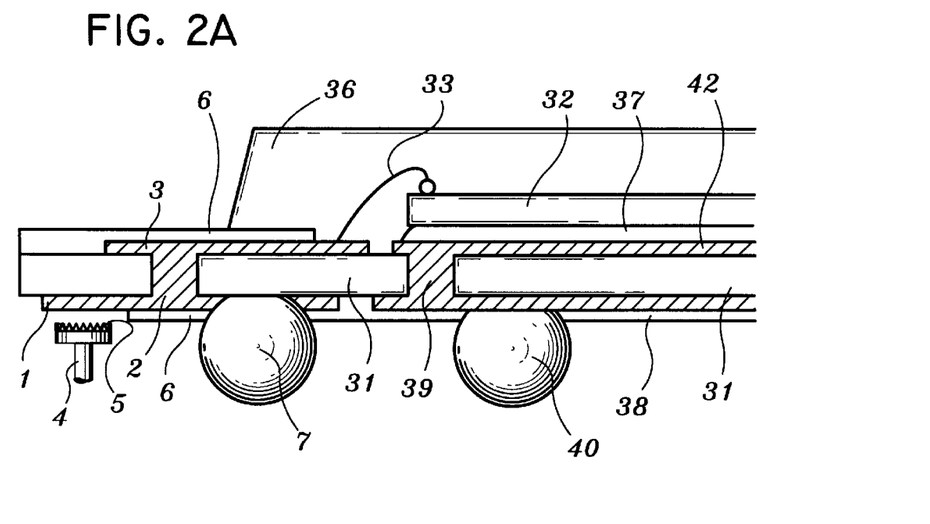
FIGS. 2A and 2B are a magnified partial cross-sectional view and a magnified partial top plan view, respectively, of a BGA semiconductor package according to another embodiment of the present invention.
Figure 2B:
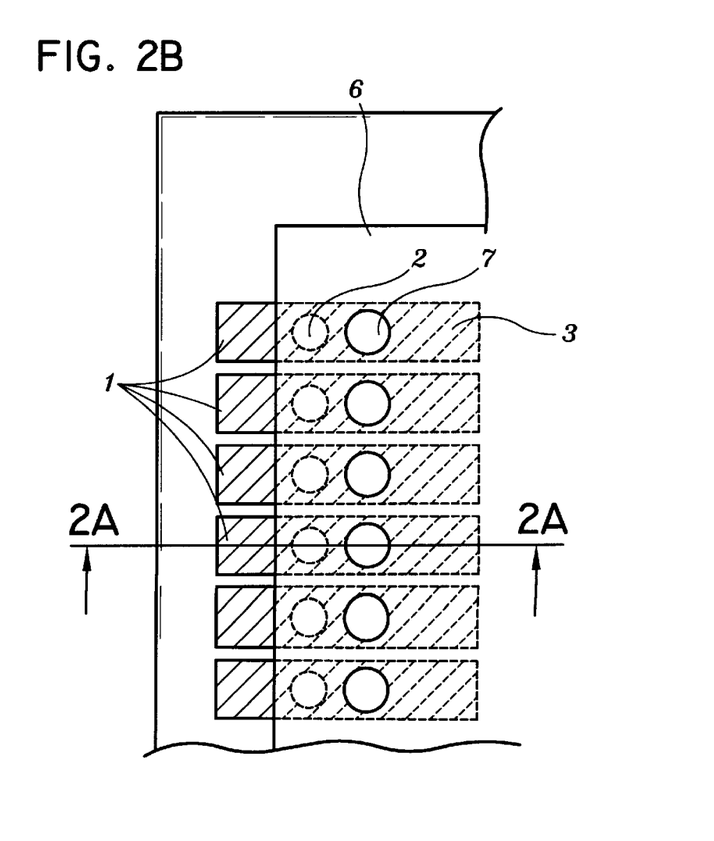

According to another embodiment of the present invention as depicted in FIGS. 2A and 2B, instead of providing test pads 1 on the top (i.e., on the side opposite to which solder balls 7 are formed), the test pads are formed on the same side of substrate 31 as solder balls 7. As shown, conductor patterns 3 extend via through-holes 2 to the lower side of the device and extend beyond an outer edge of solder resist 6 to form test pads 1 along the lower peripheral edges of the BGA semiconductor device. Test pads 1 are approximately 0.5 mm by 0.5 mm wide. Of course, as noted above, the size and shape of the test pads can be modified as desired and a protective coating such as gold plating can be provided on the test pads. As also noted above, the through-holes can be arranged in two or more staggered rows, and the test pads can extend from some or all of the conductor patterns.

Test pads 1 can be easily formed on the BGA device by selectively applying solder resist 6 to leave a portion of conductor patterns 3 exposed along the bottom peripheral edge of the semiconductor package, as shown in FIGS. 2A and 2B.

The above-described embodiments are described as having the test pads formed by selectively applying the solder resist to leave a portion of the conductive pattern exposed. However, it is also possible to form the above-described BGA semiconductor devices by applying solder resist 6 to cover the entire conductive pattern on the top and bottom surfaces of the semiconductor device. Solder resist 6 can then be selectively removed by an etching process, for example, to remove a desired portion of solder resist 6 and expose test pads 1. This allows test pads to be selectively exposed so that pads that do not need to be probed can be left covered by the solder resist.

During testing of the BGA device, a probe such as test probe 4 can be used to electrically connect each test pad 1 to a test head. Test probe 4 can have a flat end 5 which may or may not be provided with a course surface as shown. The course surface minimizes slippage of test probes 4 after they have been brought into contact with test pads 1.

Although test probes 4 provide secure and positive electrical contact with test pads 1, it may be desirable to use the test probe test pad arrangement as described below to provide even securer and more positive electrical contact.

Figure 3A:
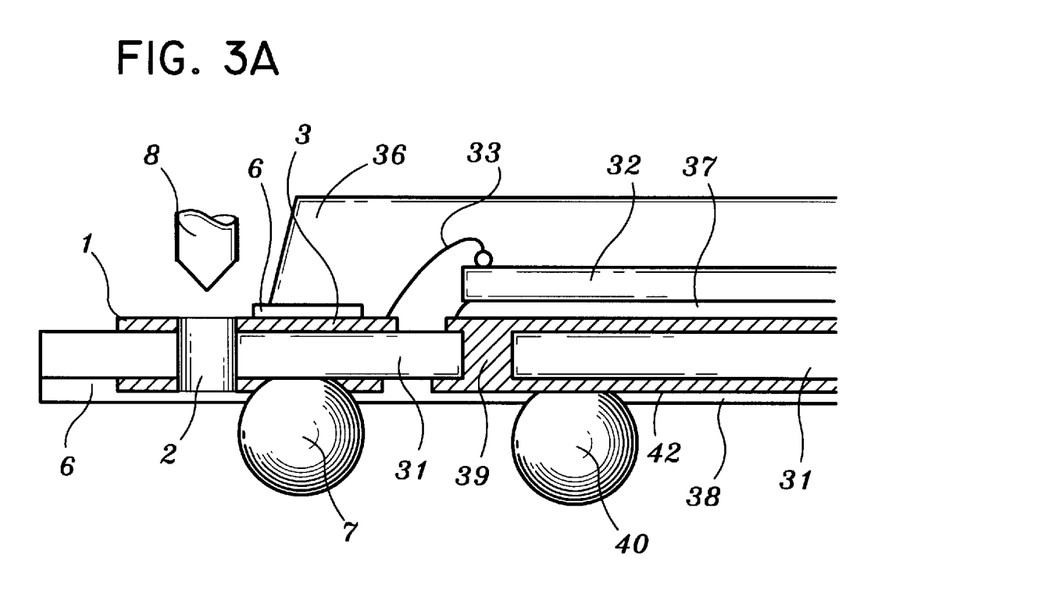
FIGS. 3A and 3B are a magnified partial cross-sectional view and a magnified partial top plan view, respectively, of a BGA semiconductor device according to another embodiment of the present invention.
Figure 3B:
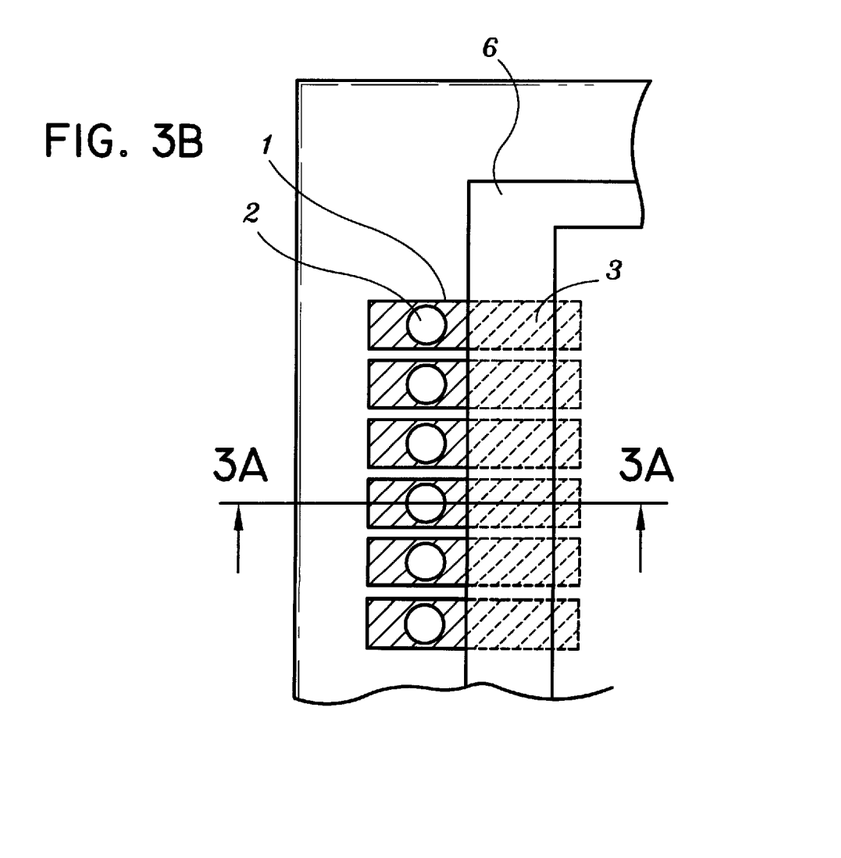

According to the embodiment of the present invention as shown in FIGS. 3A and 3B, the test pads are actually formed from the through-hole lands. A probe such as test probe 8 can be used to electrically connect the test pad to the test head. As shown, test probe 8 is in the form of a point that can be inserted into the through-hole. Such an arrangement provides even more secure and positive electrical contact between the test probes and the test pads. According to this embodiment of the present invention, test pads are formed by selectively applying solder resist 6 so that the through-hole portion of conductive pattern 3 is left exposed. Of course, the shape and size of the through-holes and conductive patterns can be modified as desired and a coating such as gold plating can be provided on the conductive patterns. In addition, as described above with reference to the previous embodiments, two or more rows of through-holes may be provided with some or all acting as test pads.

A method of testing the electrical characteristics of a BGA package semiconductor device according to an embodiment of the present invention will now be described. According to the present invention, the BGA device can be tested utilizing a conventional test device such as test head 56 shown in FIGS. 9A–9C which is also used for testing QFP semiconductor devices. A test head suitable for testing the BGA semiconductor device is manufactured by ADVANTEST, for example.

Figure 4A:
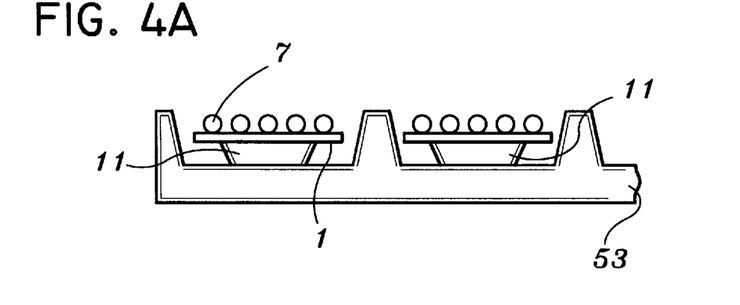
FIGS. 4A–4C are views showing a process for performing electrical tests on a BGA semiconductor device, according to an embodiment of the present invention.
Figure 4B:
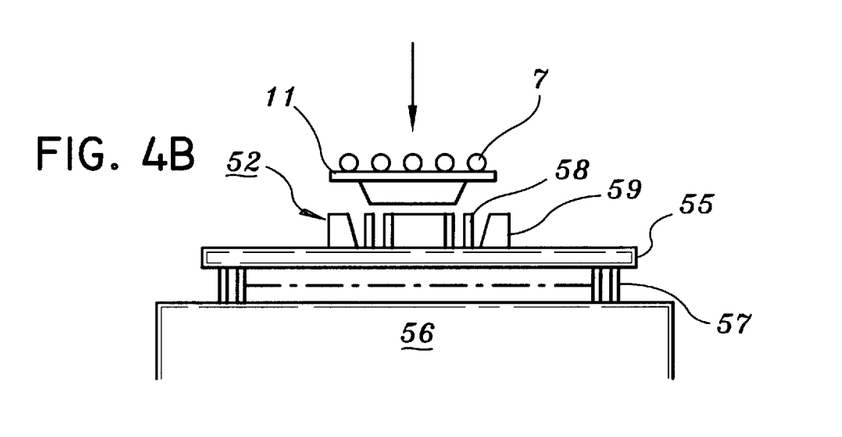

As shown in FIG. 4A, a plurality of BGA semiconductor devices 11 to be subjected to testing, each similar to the device shown in FIGS. 1A and 1B, for example, are prearranged in tray 53 with their solder balls 7 positioned on top. Test pads 1 are thus positioned on the lower side, as shown. A DUT board 55, having a socket 52 consisting of contact probes 58 and supports 59, is provided in electrical contact with test head 56 through contact pins 57, as shown in FIG. 4B. Contact probes 58 (each having a tip similar to probe 4 shown in FIG. 1A, for example) are provided, each corresponding to a test pad 1 on the BGA device to be tested.

During the test procedure, one of devices 11 is picked up and removed from tray 53 and is placed on socket 52 utilizing conventional automated equipment. More specifically, a BGA device 11 is picked up from tray 53 and is placed on supports 59 so that contact probes 58 each contact a corresponding test pad 1 provided on the surface of the semiconductor device opposite the side having solder balls 7. In this position, the side of the semiconductor device having solder balls 7 remains on top, clear from the probes and the test head. Accordingly, solder balls 7 do not need to be probed and thus, they do not get deformed and are left completely intact. After one or more predetermined electrical tests are performed, BGA device 11 is picked up from supports 59 and placed on tray 53' (which may or may not be the same as tray 53) with the same side up (i.e., the side having solder balls 7), as shown in FIG. 4C.

Figure 4C:
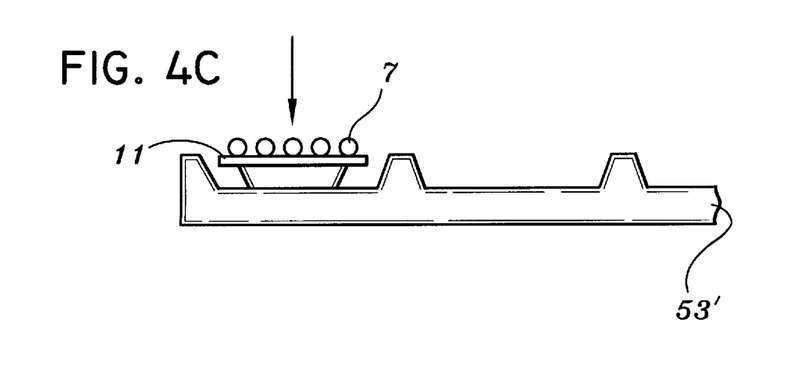

Next, if so desired, since semiconductor device 11 remains with solder balls 7 exposed as shown in FIG. 4C, a visual inspection can easily be performed without having to reposition the device. That is, a visual inspection can be made of solder balls 7 without having to flip the semiconductor device over, thus saving time and equipment necessary for testing the BGA device.

Figure 5A:
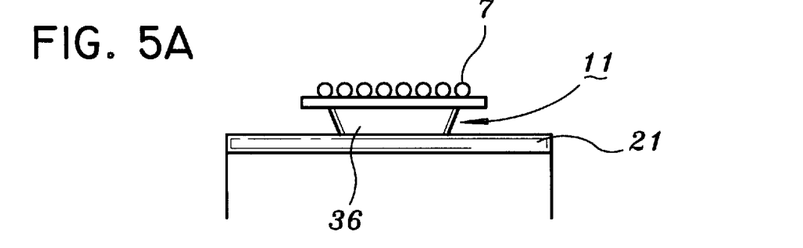
FIGS. 5A and 5B depict methods of heating a BGA semiconductor device.
Figure 5B:
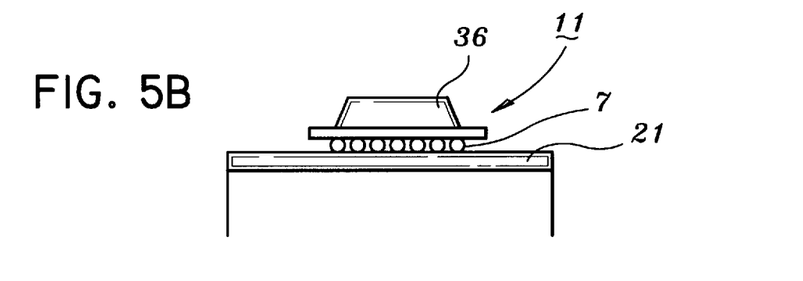

In order to more comprehensively test a semiconductor device, it is often necessary to perform the electrical tests at high temperatures. To do this, it is necessary to heat the semiconductor device to a predetermined temperature. Typically, as shown in FIG. 5B, BGA devices are heated by placing the device on a heat plate 21 with the solder ball side down on the heating surface. The BGA device is then heated through the solder balls, typically to a temperature of 70° C. However, heating the device through the solder balls is inefficient and requires a relatively lengthy period of time to heat to the desired temperature. It has been found that better heat transfer takes place if the device is heated from the side of the semiconductor device opposite the solder ball side. That is, the semiconductor device can be heated in a shorter period of time if heat is applied from molding resin 36 side, as depicted in FIG. 5A, since the molding resin material typically used has good heat conducting properties and has a larger area of contact with the heat plate than does the BGA side of the device.

Figure 6:
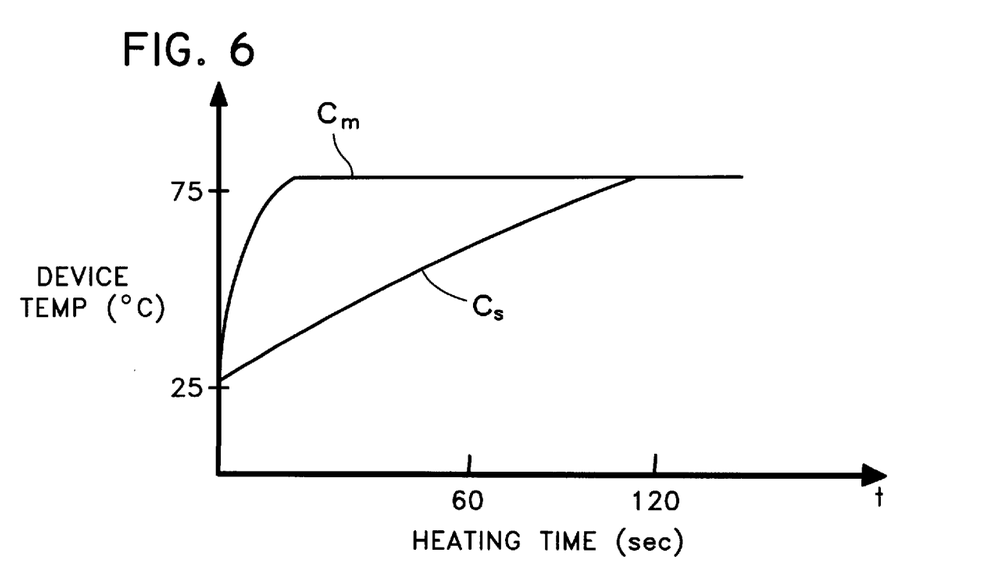
FIG. 6 is a graph showing a comparison of the effects obtained by the different heating methods depicted in FIGS. 5A and 5B.

This is illustrated more clearly by reference to FIG. 6. As shown, curve Cm indicates the change of temperature of the semiconductor device over time, when it is heated from the molding resin side. Curve Cs indicates the change of temperature of the semiconductor device over time when it is heated from the solder ball side. As can be clearly seen from FIG. 6, by heating the device from the molding resin side, it is possible to substantially reduce the time necessary for heating the semiconductor device to a required predetermined temperature. This result is also due, at least in part, to the fact that the molding resin side of the device has a wider area of direct contact with the heating surface than does the solder ball side, thus transferring the heat more efficiently. Accordingly, the device can be heated in substantially less time.

According to various embodiments of the present invention, the heat plate 21 can be provided at a separate heating station. Heat plate 21 can also be provided as part of the test head itself. For example, heat plate 21 can be provided in a central portion of socket 52 between probes 58 so that when a BGA semiconductor device 11 is placed in socket 52, heat plate 21 makes contact with molding resin side 36.

If heat plate 21 is provided at a separate heat station, the BGA device 11 is removed from tray 53 as described above and is placed on heat plate 21 so that the molding resin side is face down on the heating surface. After a sufficient period of time to allow the device to heat to a predetermined temperature, the device is removed from the heat plate and is placed on socket 52 and subjected to one or more electrical tests. On the other hand, when heat plate 21 is a part of test head 56, the semiconductor device 11 is picked up and placed directly on socket 52 and the heat plate. After sufficient time to allow the heat plate to heat the BGA device, the electrical testing of the device can be performed.

Testing of the BGA devices according to the various embodiments of the present invention can thus be performed utilizing conventional testing equipment without the need of providing additional complex and costly automated equipment.

Figure 2C:
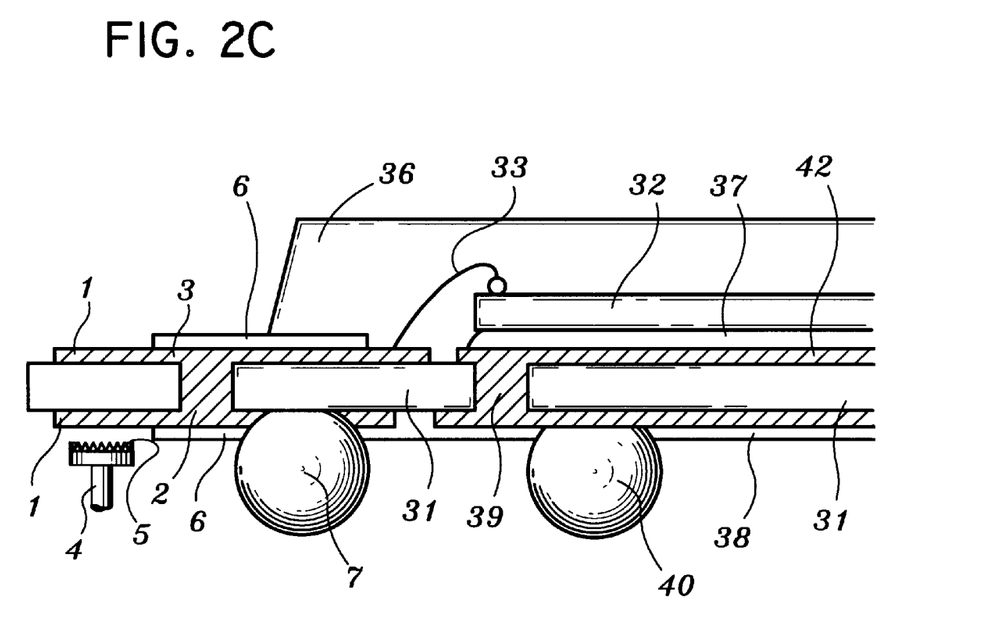
FIG. 2C is a magnified partial cross-sectional view of a BGA semiconductor package according to another embodiment of the present invention.

Although the above-described embodiments of the BGA semiconductor devices have been described as having test pads on only one side of the BGA device, it is, of course, also possible to design the BGA device to have test pads on both sides (i.e., on the side having the ball grid array and on the opposite side), as shown in FIG. 2C.

As described above, according to the present invention test pads are provided in addition to the solder balls. Accordingly, when testing the electrical characteristics of the device, probing can be performed on the test pads, so that the tests can be conducted with the solder balls being left intact. Accordingly, no defects in outward appearance, such as flaws, dents, chips, are generated on the solder balls.

In the BGA semiconductor device of the present invention, since the test pads can be provided on the side of the device opposite the side on which the solder balls are formed, the electrical tests and visual inspection tests can be simplified and can be performed without damage to the solder balls. That is, utilizing the inspection method described above, electrical testing can be performed while keeping the solder balls intact; that is, without damaging the solder balls. The probes can be brought into contact with the test pads from below the semiconductor device, so that it is possible to employ an existing test apparatus such as that typically used for testing QFP type semiconductor packages. After the electrical testing is complete, the device can be arranged in a tray with the surface having the solder balls on top. Accordingly, visual inspection of the BGA device can be performed after the electrical tests without having to extract the device from the tray and invert it. This means that there is no need to provide additional equipment and steps necessary for inverting and moving the semiconductor devices from one tray to another which would require more time and thus less throughput of tested devices.

The present invention also allows a predetermined heating method to be used which allows the semiconductor device to be heated through the molding resin side of the device to a predetermined temperature in a relatively short amount of time, again, without having to invert the device during testing. Accordingly, a substantial additional reduction in inspection time can be achieved.

It will be understood that various modifications can be made to the embodiments of the present invention herein described without departing from the spirit thereof. The above-description should not be construed as limiting the invention, but merely as exemplifications of preferred embodiments thereof. Those skilled in the art will envision other modifications within the scope and spirit of the present invention as defined by the claims appended hereto.

What is claimed is:

1. A semiconductor device comprising:

a substrate;

a semiconductor chip permanently mounted on the substrate;

a plurality of terminals provided on a first side of the substrate, each electrically connected to the semiconductor chip, the first side being a side other than a side on which the semiconductor chip is permanently mounted; and a plurality of test pads provided on the substrate for performing electrical characteristic tests on the semiconductor chip, each test pad being electrically connected to a respective terminal in one-to-one correspondence.

2. A semiconductor device according to claim 1, wherein the plurality of test pads are provided on a side of the substrate other than the first side.

3. A semiconductor device according to claim 1, wherein the plurality of test pads are provided on a side of the substrate opposite the first side.

4. A semiconductor device according to claim 1, wherein the plurality of test pads are provided on the first side of the substrate.

5. A semiconductor device according to claim 1, wherein the plurality of test pads are provided on the first side of the substrate and also on a side of the substrate other than the first side.

6. A semiconductor device according to claim 1, wherein a protective material covers the semiconductor chip.

7. A semiconductor device according to claim 6, wherein the protective material comprises a molding resin.

8. A semiconductor device according to claim 6, wherein the protective material has heat conductive properties.

9. A semiconductor device according to claim 1, wherein a protective coating is provided on the plurality of test pads.

10. A semiconductor device as recited in claim 9, wherein the protective coating comprises gold plating.

11. A semiconductor device according to claim 1, wherein the plurality of test pads comprise a portion of a conductive material electrically connecting the semiconductor chip and the plurality of terminals.

12. A semiconductor device according to claim 1, wherein the semiconductor device comprises a BGA package semiconductor device.

13. A semiconductor device according to claim 12, wherein the plurality of terminals comprise a plurality of solder balls.

14. A semiconductor device according to claim 12, wherein the plurality of test pads are provided on a side of the substrate opposite the first side and comprise a portion of a conductive material electrically connecting the semiconductor chip and the solder balls.

15. A semiconductor device according to claim 12, wherein the plurality of test pads are provided on the first side of the substrate.

16. A semiconductor device according to claim 12, wherein the plurality of test pads are provided on a side of the substrate opposite the first side and also on the first side.

17. A semiconductor device according to claim 12, wherein the plurality of test pads comprise a plurality of conductive through-hole lands.

18. A semiconductor device comprising:

a substrate;

a semiconductor chip permanently mounted on a first side of the substrate;

a plurality of terminals provided on a second side of the substrate, each electrically connected to the semiconductor chip, the first side being different than the second side; and a plurality of test pads provided on at least one of the first and second sides of the substrate for performing electrical characteristic tests on the semiconductor chip, each test pad being electrically connected to a respective terminal in one-to-one correspondence.

19. A ball grid array (BGA) package semiconductor device comprising:

a substrate;

a semiconductor chip permanently mounted on a side of the substrate;

a plurality of terminals provided on a side of the substrate opposite the side on which the semiconductor chip is mounted, each terminal electrically connected to the semiconductor chip; and a plurality of test pads for performing electrical characteristic tests on the semiconductor chip, each test pad being electrically connected to a respective terminal in one-to-one correspondence.

* * * * *